United States Patent
Budai et al.

[11] Patent Number: 5,968,877
[45] Date of Patent: *Oct. 19, 1999

[54] HIGH TC YBCO SUPERCONDUCTOR DEPOSITED ON BIAXIALLY TEXTURED NI SUBSTRATE

[75] Inventors: John D. Budai; David K. Christen, both of Oakridge; Amit Goyal, Knoxville; Qing He, Knoxville; Donald M. Kroeger, Knoxville; Dominic F. Lee, Knoxville; Frederick A. List, III, Andersonville; David P. Norton, Knoxville; Mariappan Paranthaman, Knoxville; Brian C. Sales, Knoxville; Eliot D. Specht, Knoxville, all of Tenn.

[73] Assignee: Lockheed Martin Energy Research Corp, Oak Ridge, Tenn.

[*] Notice: This patent is subject to a terminal disclaimer.

[21] Appl. No.: 08/670,871

[22] Filed: Jun. 26, 1996

Related U.S. Application Data

[63] Continuation-in-part of application No. 08/419,583, Apr. 10, 1995, Pat. No. 5,741,377.

[51] Int. Cl.$^6$ .................................................. C30B 29/22
[52] U.S. Cl. ........................ 505/237; 505/447; 505/474; 117/86; 117/947
[58] Field of Search ............................ 505/237, 447, 505/474; 117/947, 86

[56] References Cited

U.S. PATENT DOCUMENTS 5,145,832  9/1992  Harshavardhan et al. ............... 505/237

FOREIGN PATENT DOCUMENTS

96/32201  10/1996  WIPO .

OTHER PUBLICATIONS

Ermolov et al, "YBCO Thin-Films Current-Carrying Elements on Metalic Substrate", IEEE Transactions on Applied Superconductivity, vol. 5, No. 2 Jun. 1995 pp. 1929–1931.

Reade et al. "Laser deposition of biaxially textured yttria-stabilized zirconia buffer layers . . . " Appl, Phys. Lett 61(18) Nov. 2, 1992 pp. 2231–2233.

Iijima et al, "Structural and transport properties of biaxially aligned $YBa_2Cu_3O_{7-x}$ film in" J. Appl. Phys. 74(3) Aug. 1, 1993 pp. 1905–1911.

Tian et al "Epitaxial Formation and Characterization of $CeO_2$ Films"MRS Proc. vol. 355 1995.

K. Sato, et al., "High-$J_c$ Silver-Sheathed Bi-Based Superconducting Wires", *IEEE Transactions on Magnetics*, 27 (1991) 1231.

K. Heine, et al., "High-Field Critical Current Densities in $Bi_2Sr_2Ca_1Cu_2O_{8+x}$/Ag Wires", *Applied Physics Letters*, 55 (1991) 2441.

R. Flukiger, et al., "High Critical Current Densities in Bi(2223)/Ag tapes", *Superconductor Science & Technology* 5, (1992) S61.

D. Dimos et al., "Orientation Dependence of Grain-Boundary Critical Currents in $Y_1Ba_2Cu_3O_{7-\delta}$ Bicrystals", *Physical Review Letters*, 61 (1988) 219.

D. Dimos et al., "Superconducting Transport Properties of Grain Boundaries in $Y_1Ba_2Cu_3O_7$ Bicrystals", *Physical Review B*, 41 (1990) 4038.

Y. Iijima, et al., "Structural and Transport Properties of Biaxially Aligned $YBa_2Cu_3O_{7-x}$ Films on Polycrystalline Ni-Based Alloy with Ion-Beam Modified Buffer Layers", *Journal of Applied Physics*, 74 (1993) 1905.

R. P. Reade, et al. "Laser Deposition of biaxially textured Yttria-Stabilized Zirconia Buffer Layers on Polycrystalline Metallic Alloys for High Critical Current Y-Ba-Cu-O Thin Films", *Applied Physics Letters*, 61 (1992) 2231.

(List continued on next page.)

*Primary Examiner*—Robert Kunemund

[57] ABSTRACT

A superconducting article includes a biaxially-textured Ni substrate, and epitaxial buffer layers of Pd (optional), $CeO_2$ and YSZ, and a top layer of in-plane aligned, c-axis oriented YBCO having a critical current density ($J_c$) in the range of at least 100,000 A/cm$^2$ at 77 K.

44 Claims, 17 Drawing Sheets

OTHER PUBLICATIONS

D. Dijkkamp et al., "Preparation of Y–Ba–Cu Oxide Superconducting Thin Films Using Pulsed Laser Evaporation from High Tc Bulk Material," *Applied Physics Letters*, 51, 619 (1987).

S. Mahajan et al., "Effects of Target and Template Layer on the Properties of Highly Crystalline Superconducting a–Axis Films of $YBa_2Cu_3O_{7-x}$ by DC–Sputtering," *Physica C*, 213, 445 (1993).

A. Inam et al., "A–axis Oriented Epitaxial $YBa_2Cu_3O_{7-x}/PrBa_2CU_3O_{7-x}$ Heterostructures," *Applied Physics Letters*, 57, 2484 (1990).

R. E. Russo et al., "Metal Buffer Layers and Y–Ba–Cu–O Thin Films on Pt and Stainless Steel Using Pulsed Laser Deposition," *Journal of Applied Physics*, 68, 1354 (1990).

E. Narumi et al., "Superconducting $YBa_2Cu_3P_{6.8}$ Films on Metallic Substrates Using In Situ Laser Deposition," *Applied Physics Letters*, 56, 2684 (1990).

J. D. Budai et al., "In–Plane Epitaxial Alignment of $YBa_2Cu_3O_{7-x}$ Films Grown on Silver Crystals and Buffer Layers," *Applied Physics Letters*, 62, 1836 (1993).

T. J. Doi et al., "A New Type of Superconducting Wire; Biaxially Oriented $Tl_1(Ba_{0.8}Sr_{0.2})_2Ca_2Cu_3O_9$ on {100}<100> Textured Silver Tape," *Proceedings of 7th International Symposium on Superconductivity*, Fukuoka, Japan, Nov. 8–11, 1994.

D. Forbes, Executive Editor, "Hitachi Reports 1–meter Tl–1223 Tape Made by Spray Pyrolysis", *Superconductor Week*, vol. 9, No. 8, Mar. 6, 1995.

*Recrystallization, Grain Growth and Textures*, Papers presented at a Seminar of the American Society for Metals, Oct. 16 and 17, 1965, American Society for Metals, Metals Park, Ohio.

S. N. Ermolov, V. A. Bliznyuk, V. M. Ecviev, A. Yu.Isanv and V. A. Lykhin, "YBCO Thin Films Current–Carrying Elements on Metallic Substrates," *IEEE Transactions on Applied Superconductivity*, vol. 5, No. 2, Jun. 1995, p. 1929.

Chunyan Tian, Yang Du, and Siu–Wai Chan, "Epitaxial Formation and Characterization of $CeO_2$ Films," *MRS Proceeding*, vol. 355 on Evolution of Thin Film and Surface Structure and Morphology, edited by B. G. Demczyk, E. D. Williams, E. Garfunkel, B. M. Clemens, J. J. Cuomo, 1995, ISDN: 1–55899–256–1.

X. D. Wu, S. R. Foltyn, P. Arendt, J. Townsend, C. Adams, I. H. Campbell, P. Tiwari, Y. Coulter, and D.E. Peterson, *Appl. Phys. Lett.*, V. 65 (15), Oct. 10, 1994, p. 1961.

M. Yoshimoto et al, "Room Temperature Epitaxial Depositth of $CeO_2$ Thin Films on Si(111) Substrates for Fabrication of Sharp Oxide/Silicon Interface," *Jpn. J. Appl. Phys.*, 34, L688 (1995).

H. Makita et al, "Recrystallization of Cold–Rolled Pure Nickel," *Acta Metall.*, vol. 36, (1988), 403.

A. Ginbach et al, Depositth of C–Axis Oriented YBaCuO Films on Oxidized Textured Ni Sheets and on (100) and (110) Oriented NiO Single Crystals, *IIE Transactions on Magnetics*, vol. 27, (1991) 1410.

HIGH TC YBCO SUPERCONDUCTOR DEPOSITED ON BIAXIALLY TEXTURED NI SUBSTRATE

CROSS-REFERENCE TO RELATED APPLICATIONS

The present application is a continuation-in-part application of U. S. patent application Ser. No. 08/419,583 filed on Apr. 10, 1995, issued as U.S. Pat. No. 5,741,377 on Apr. 21, 1998, entitled, "Structures Having Enhanced Biaxial Texture and Method of Fabricating Same", the entire disclosure of which is incorporated herein by reference.

The United States Government has rights in this invention pursuant to contract no. DE-AC05-96OR22464 between the United States Department of Energy and Lockheed Martin Energy Research Corporation.

FIELD OF THE INVENTION

The present invention relates to biaxially textured metallic substrates and articles made by rolling a metallic substrate to obtain a biaxial texture, followed by deposition of epitaxial materials thereon, and more particularly to such materials which include superconductors having critical current densities (Jc) of at least 100,000 Amps/cm$^2$ at a temperature of 77 K.

BACKGROUND OF THE INVENTION

The above identified U.S. patent application describes various methods of preparing biaxially textured structures which are useful for subsequent fabrication of high Tc superconductors. Said application gives no specific parameters for fabrication of superconductors having critical current densities (Jc) of at least 100,000 Amps/cm$^2$ at a temperature of 77 K. For related information in addition to the references cited in the above identified U.S. patent application, please refer to the following publications:

1) S. N. Ermolov, V. A. Bliznyuk, V. M. Ecviev, A. Yu.Isanv and V. A. Lykhin, "YBCO Thin-Films Current-Carrying Elements on Metallic Substrates," *IEEE Transactions on Applied Superconductivity*, Vol. 5, No. 2, June 1995, p. 1929.

2) Chunyan Tian, Yang Du, and Siu-Wai Chan, "Epitaxial Formation and Characterization of CeO$_2$ Films," *MRS Proceeding*, Vol. 355 on Evolution of Thin Film and Surface Structure and Morphology, edited by B. G. Demczyk, E. D. Williams, E. Garfunkel, B. M. Clemens, J. J. Cuomo, 1995, ISDN: 1-55899-256-1.

3) X. D. Wu, S. R. Foltyn, P. Arendt, J. Townsend, C. Adams, I. H. Campbell, P. Tiwari, Y. Coulter, and D. E. Peterson, *Appl. Phys. Lett.*, V. 65 (15), Oct. 10, 1994, p. 1961.

4) M. Yoshimoto et al, "Room Temperature Epitaxial Deposition of CeO$_2$ Thin Films on Si(111) Substrates for Fabrication of Sharp Oxide/Silicon Interface," *Jpn. J. Appl. Phys.*, 34, L688 (1995).

5) H. Makita et al, "Recrystallization of Cold-Rolled Pure Nickel," *Acta Metall.*, Vol. 36, (1988),403.

6) A. Ginbach et al, "Deposition of C-Axis Oriented YBaCuO Films on Oxidized Textured Ni Sheets and on (100) and (110) Oriented NiO Single Crystals, *IEEE Transactions on Magnetics*, Vol. 27, (1991) 1410.

OBJECTS OF THE INVENTION

Accordingly, objects of the present invention include the provision of new and improved superconductors having critical current densities (Jc) of at least 100,000 Amps/cm$^2$ at a temperature of 77K.

Further and other objects of the present invention will become apparent from the description contained herein.

SUMMARY OF THE INVENTION

In accordance with one aspect of the present invention, the foregoing and other objects are achieved by a biaxially textured article which includes a biaxially textured Ni substrate having thereon an epitaxial buffer layer of CeO$_2$.

In accordance with another aspect of the present invention, other objects are achieved by a biaxially textured article comprising a biaxially textured Ni substrate having thereon an epitaxial layer of palladium, the layer of palladium having thereon an epitaxial buffer layer of CeO$_2$.

In accordance with yet another aspect of the present invention, a biaxially textured article includes a biaxially textured Pd substrate having thereon an epitaxial buffer layer of CeO$_2$, the epitaxial buffer layer of CeO$_2$ having thereon an epitaxial buffer layer of yttria-stabilized ZrO$_2$ (YSZ).

In accordance with still yet another aspect of the present invention, a method of preparing a biaxially textured article comprising the steps of: providing a biaxially textured Ni substrate having a surface and depositing onto the surface, in the presence of hydrogen gas, an epitaxial buffer layer of CeO$_2$.

In accordance with a further aspect of the present invention, a method of preparing a biaxially textured article includes the steps of: providing a biaxially textured Ni substrate having a surface; depositing onto the surface an epitaxial buffer layer of palladium; and, depositing onto the epitaxial buffer layer of palladium an epitaxial buffer layer of CeO$_2$.

In accordance with yet another aspect of the present invention, a method of preparing a biaxially textured article includes the steps of: providing a biaxially textured Pd substrate having a surface; and depositing onto the surface an epitaxial buffer layer of CeO$_2$.

For a better understanding of the present invention, together with other and further objects, advantages and capabilities thereof, reference is made to the following disclosure and appended claims in connection with the above-described drawings.

DETAILED DESCRIPTION OF THE INVENTION

Ni/Pd/$CeO_2$/YSZ/YBCO Superconductor

Figure 1:
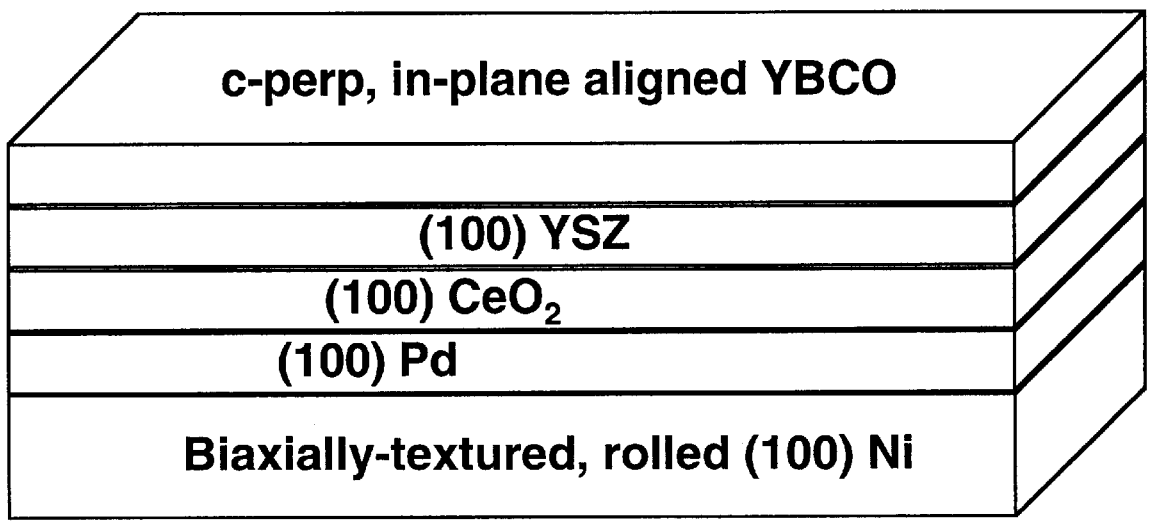
FIG. 1 is a schematic representation of a superconducting article in accordance with the present invention, comprising a biaxially-textured Ni base metal substrate, with deposited epitaxial layers of Pd, CeO$_2$, YSZ, and YBa$_2$ Cu$_3$O$_7$ (YBCO).

Superconducting Article: A superconducting article in accordance with the present invention, shown schematically in FIG. 1, generally comprises a biaxially-textured (100) Ni substrate, and epitaxial buffer layers of (100) Pd layer, $CeO_2$ and YSZ, and a top layer of in-plane aligned, c-axis oriented YBCO. The (100) Ni preferably has a degree of texture such that the in-plane and out-of-plane alignment is approximately 15° or less, as determined by the full-width-half-maximum of the x-ray diffraction peaks.

Superconducting Article Properties: The YBCO film, Pd, $CeO_2$, and YSZ buffer layers are epitaxial with respect to the Ni substrate, with the degree of in-plane and out-of-plane alignment comparable to or better than the base Ni substrate. The superconducting transition temperature is preferably greater than 82 K, with a critical current density ($J_c$) in the range of at least 100,000 A/cm² at 77 K. In addition, the magnetic field dependence of $J_c$ will usually be similar to that observed for epitaxial YBCO deposited on single crystal oxide substrates.

Method of Preparation: Prior to deposition, a smooth (100) Ni substrate is preferably cleaned with detergents, organic solvents, and/or etchants. Ion sputter cleaning can also be employed.

The Pd layer is generally deposited by vapor phase techniques such as sputtering, evaporation, or pulsed laser deposition (PLD), usually at substrate temperatures in the range from near room temperature to 600° C., preferably in the range of 400° C. to 500°C. Improvements in the biaxial texture of the Pd layer can be achieved by an oxygen-free post anneal at temperatures and annealing times that provide some recrystallization, with minimal interdiffusion into the base metal substrate.

The $CeO_2$ layer is subsequently deposited using either sputtering or pulsed laser deposition at substrate temperatures below 200° C. For best results using PLD, an initial $CeO_2$ layer is deposited below 200° C. in a background pressure of less than $10^{-5}$ Torr, having a thickness of about 10 to 1000 nm, preferably 50 to 200 nm, 100 nm being most preferred. The substrate is then heated in vacuum for subsequent $CeO_2$ and YSZ epitaxial deposition at a higher temperature, in the range of 500° C. to 820° C., preferably in the range of 650° C. to 800° C. Heating in vacuum preferred to diffuse the Pd into the Ni prior to the introduction of oxygen. Without this step, significant roughening of the surface generally occurs. Total $CeO_2$/YSZ buffer layer thickness is preferably at least 400 nm. The YBCO film is deposited by PLD at approximately 780° C. in ~200 mTorr oxygen pressure. The article is then cooled to room temperature with oxygen pressure increased to approximately 600 Torr during the cool-down.

EXAMPLE I

Figure 2:
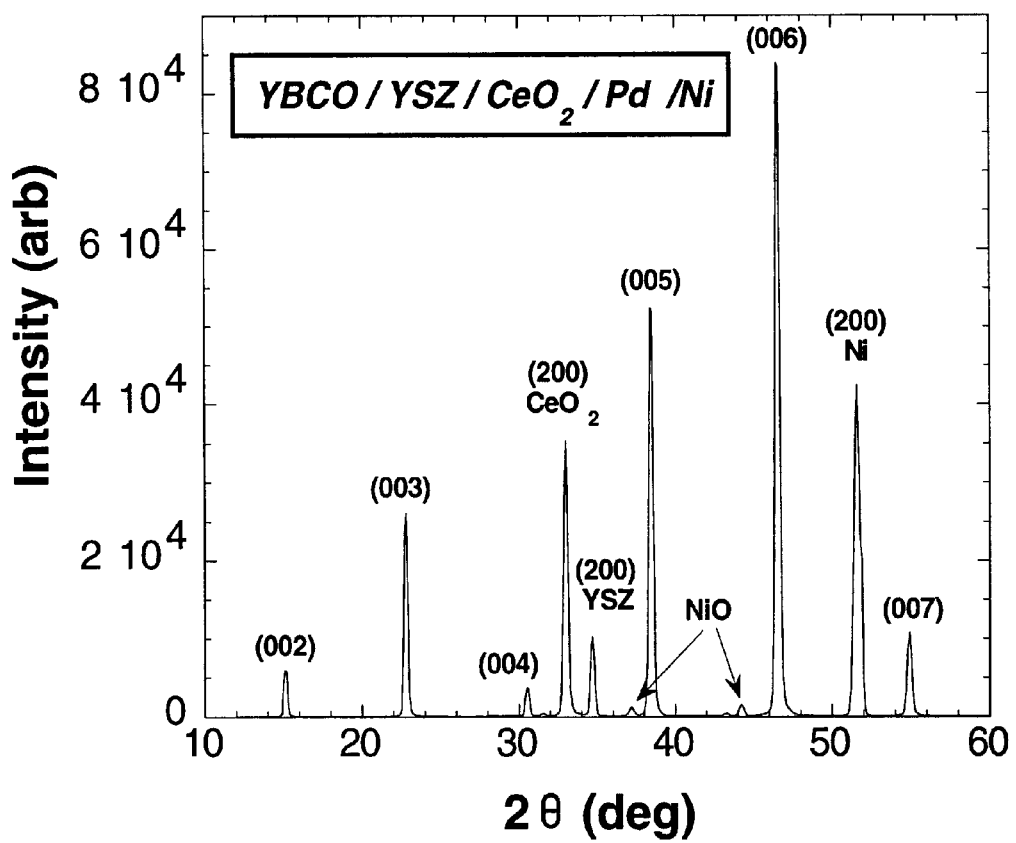
FIG. 2 shows X-ray diffraction 0–20 scans of a superconducting article in accordance with the present invention, showing predominantly (001) reflections of the CeO$_2$, YSZ, and YBCO, indicating crystalline alignment of all three layers.
Figure 3:
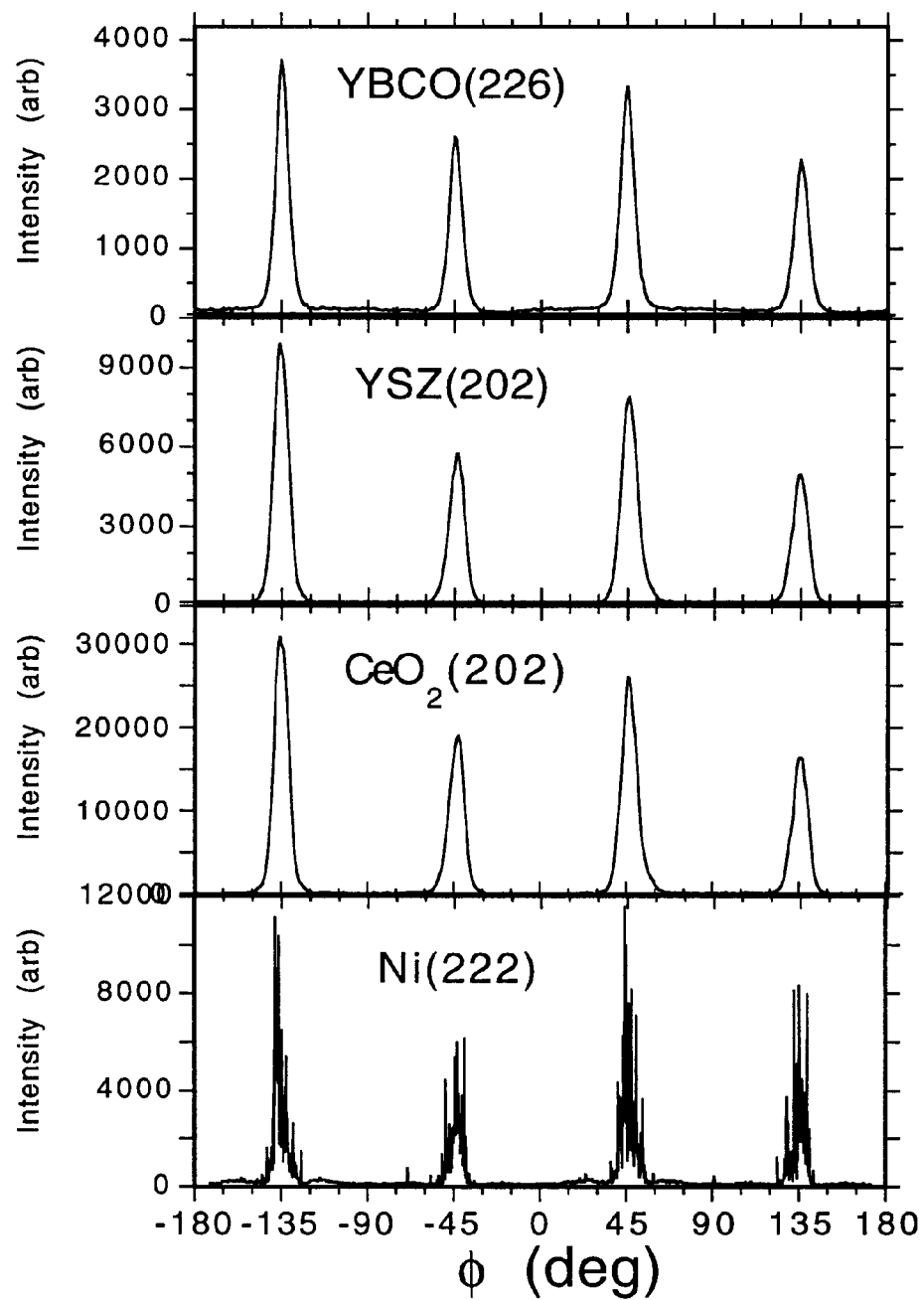
FIG. 3 shows X-ray diffraction 4b-scans of off-axis reflections, showing the in-plane alignment of the base metal Ni, buffer layers of CeO$_2$ and YSZ, and top layer of YBCO in accordance with the present invention. The epitaxial layers replicate the 8 FWHM peak-width of the Ni substrate.
Figure 4:
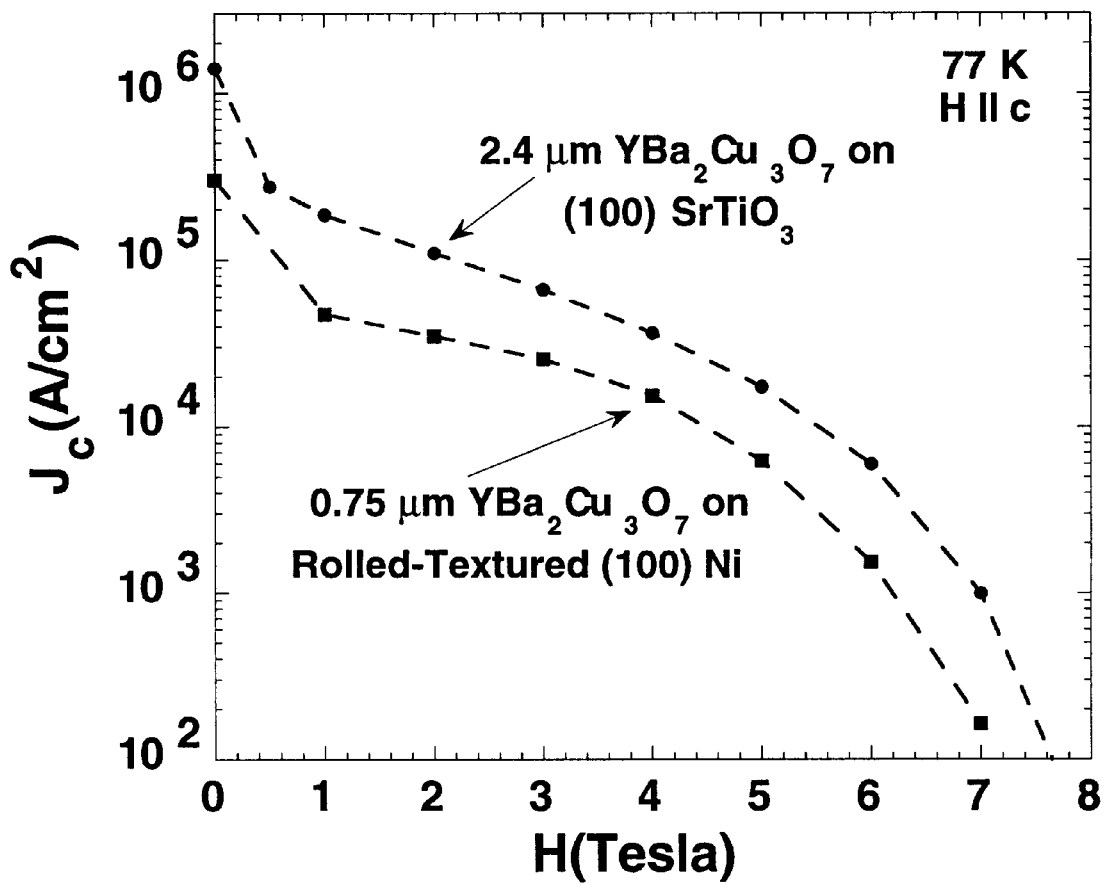
FIG. 4 shows the dependence of critical current density Jc on magnetic field at 77 K. The superconducting article in accordance with the present invention is compared to a YBCO epitaxial film deposited on the single crystal oxide substrate SrTiO$_3$. The magnetic field is applied parallel to the crystal c-axis, which is the applications-limiting situation.

A roll-textured (100)-oriented Ni tape of approximately 125 μm thickness was formed with 99.99% pure Ni that was initially randomized with respect to texture by sequentially rolling and annealing at low temperatures to a grain size of <1 mm. The Ni was subsequently rolled using polished rollers to a thickness of 125 μm. The metal was reduced 5% per pass until it was 50% of its original thickness. Subsequently, the Ni was reduced 10% per pass to a total reduction of 95%. The direction of rolling was reversed in each pass. The rolled Ni was then annealed in vacuum at ~820° C. for about 3 hours. Pd was deposited at 500° C. by electron-beam evaporation thereon. $CeO_2$ was deposited by PLD to a thickness of ~100 nm at 100° C. in a vacuum of less than $10^{-6}$ Torr. A KrF excimer laser was used as the ablation source. The substrate was then heated to 780° C. in a background pressure less than $2 \times 10^{-5}$ Torr. A subsequent $CeO_2$ layer ~400 nm thick was then deposited by PLD at 780° C. in an oxygen pressure of 4×10$^{-4}$ Torr. A 500 nm thick YSZ layer was then deposited under the same conditions. Following the YSZ layer, a 750 nm thick YBCO film was deposited at 780° C. in an oxygen pressure of 180 mTorr. The structure was then cooled at 10° C./min in an oxygen pressure of 180 mTorr. At 400° C., the oxygen pressure was increased to 690 Torr. After film deposition, the sample was annealed in pure oxygen at 450° C. for approximately 1 hour. A θ-2θ x-ray diffraction scan of the article, as shown in FIG. 2, indicates mostly (100) orientation of the $CeO_2$ and YSZ layers with the YBCO film c-axis oriented. Rocking curves through (001) peaks for the various layers show out-of-plane FWHM of ~7° for the $CeO_2$ and YSZ, and 4° for the YBCO. For comparison, the out-of-plane FWHM of the Ni substrate was 13°. The in-plane alignment of the epitaxial YBCO/YSZ/$CeO_2$/Pd/Ni structure, as determined by x-ray diffraction Φ-scans, is shown in FIG. 3. The in-plane FWHM of all layers and Ni substrate is approximately 8°. The YBCO layer was superconducting with a superconducting transition temperature of ~87 K, and a critical current density of 300,000 A/cm$^2$ at 77 K. The magnetic field dependence of the $J_c$ at 77 K is shown in FIG. 4. The field dependence of the superconducting article described above is similar to that observed for epitaxial YBCO deposited on (100) single crystal $SrTiO_3$.

Ni/Pd/$CeO_2$/YSZ Article

Oxide Buffer Layer Article: The oxide buffer layer article, useful in obtaining epitaxial oxide films on oxidizing metal surfaces, comprises epitaxial layers of (100) Pd and $CeO_2$. The article may also include a top YSZ layer as an additional oxide buffer. Such articles have a top layer that is essentially free of gross structural defects.

Oxide Buffer Layer Article Properties: When epitaxially deposited on a biaxially-textured (100) Ni surface, the $CeO_2$/Pd and/or YSZ/$CeO_2$/Pd buffer layer article replicates the crystallographic texture of the underlying metal, while providing a barrier to chemical interaction of the substrate metal with subsequent oxide films.

Method of Preparation: The Pd, $CeO_2$, and YSZ are deposited as described for the superconducting article described hereinabove. For each epitaxial buffer layer, both the in-plane and out-of-plane crystallographic orientation of the metal substrate is replicated. The subsequent deposition on the article of biaxially-textured oxides, such as high temperature superconductors, ferroelectrics, magnetic layers, etc., can then be realized.

EXAMPLE II

Figure 5:
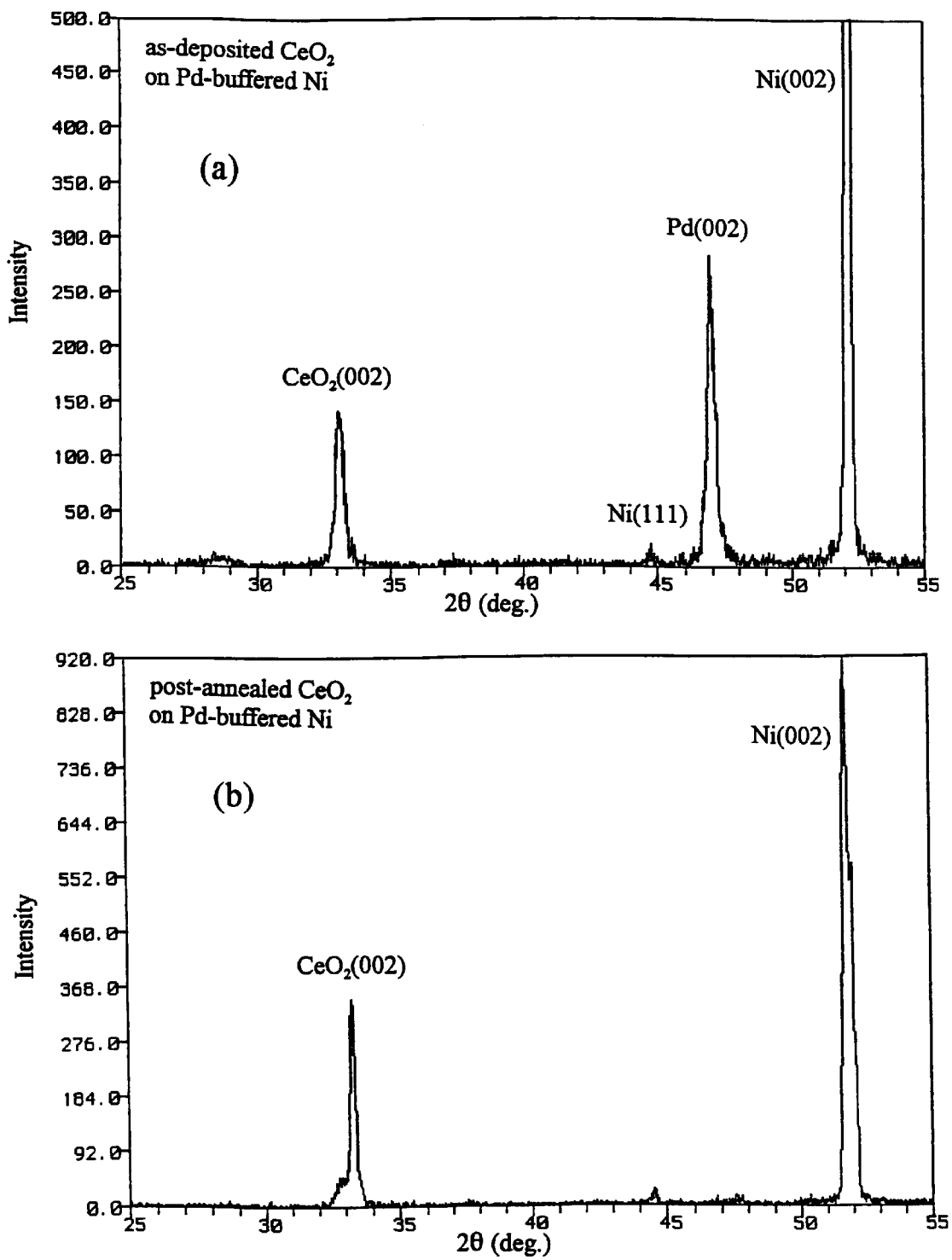
FIG. 5 shows, in accordance with the present invention, X-ray diffraction 0–20 scans for CeO$_2$ film (a), as deposited on Pd-buffered Ni substrates at room temperature, and (b) for the post-annealed CeO$_2$, film on Pd-buffered Ni. The annealing condition is 730° C. for 3 hours in oxygen with 2.3×10$^{-4}$ Torr partial pressure. Both films show good c-axis orientation.
Figure 6:
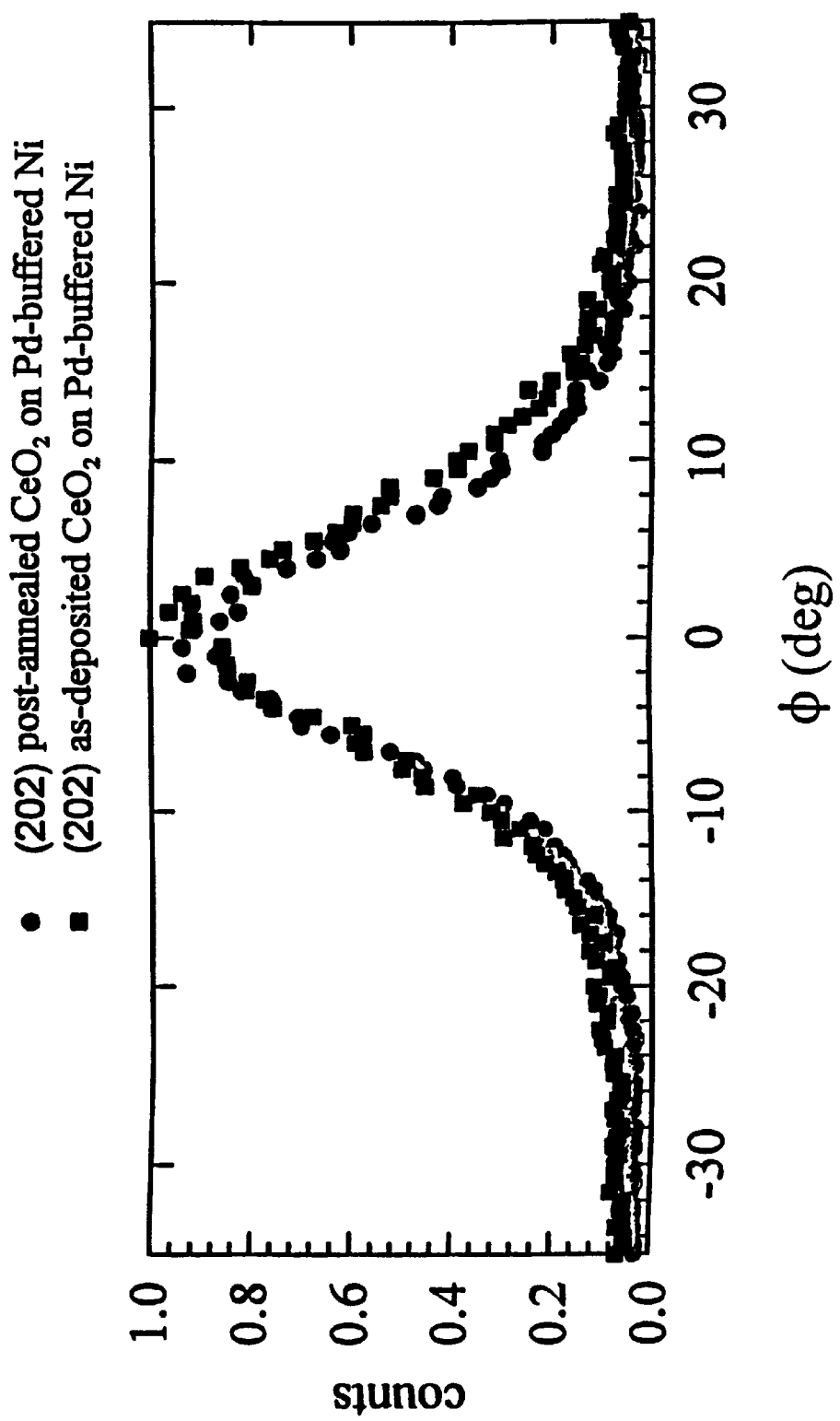
FIG. 6 shows, in accordance with the present invention X-ray diffraction Φ-scans for as-deposited and post-annealed $CeO_2$ films on Pd-buffered Ni substrates with in-plane FWHM values of 15.6° and 11.5°, respectively.
Figure 7:
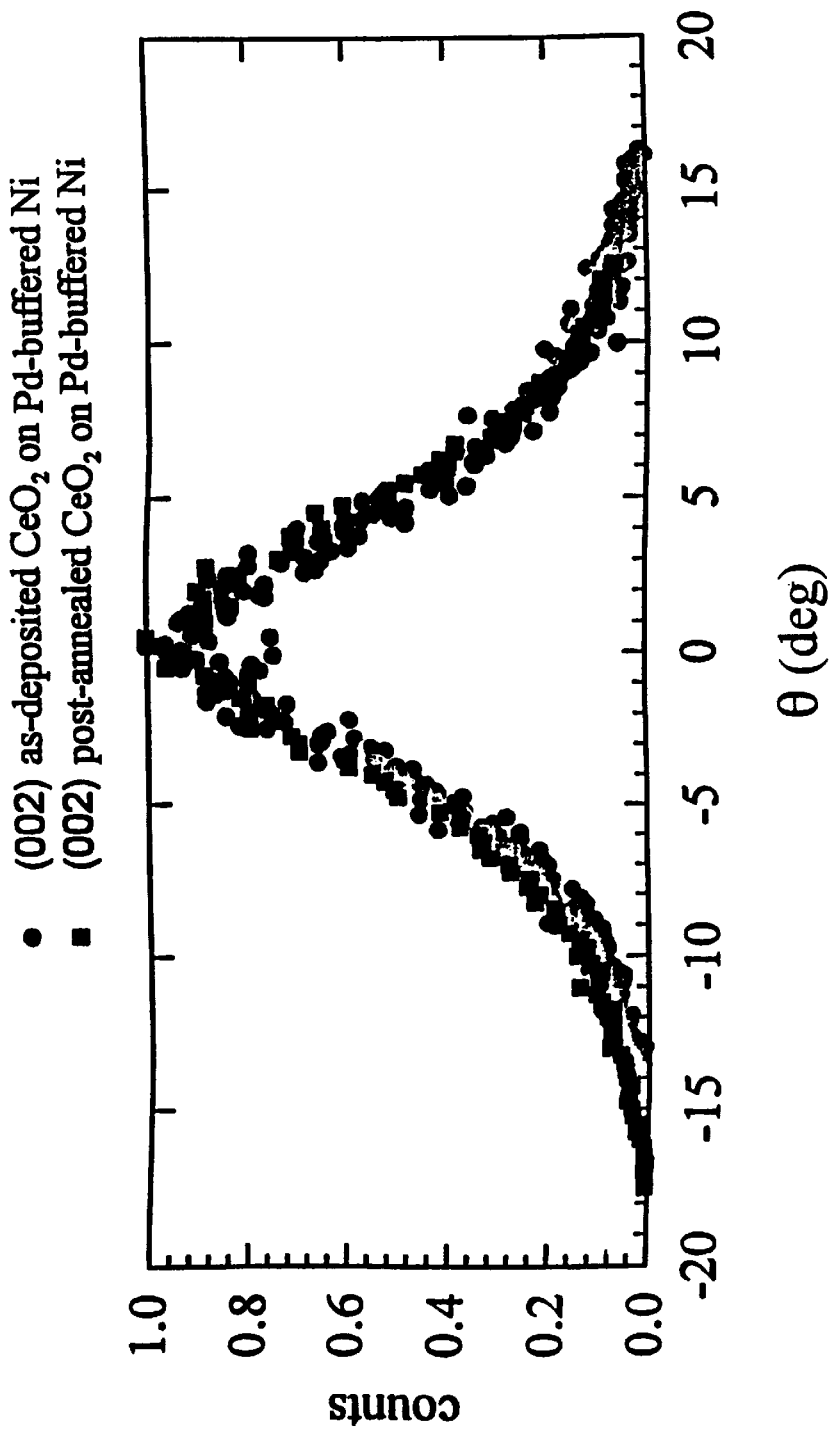
FIG. 7 shows, in accordance with the present invention X-ray diffraction θ-scans for as-deposited and post-annealed $CeO_2$ films on Pd-buffered Ni substrates with out-of-plane FWHM values of 10° and 8°, respectively.

Biaxially textured Ni substrates were cleaned using acetone and methanol. Reverse sputtering in high purity Ar gas was carried out for 5–10 minutes to further clean the Ni substrates. DC magnetron sputtering was used to deposit Pd films, with RF magnetron sputtering used to deposit the $CeO_2$ films. The substrates were kept at room temperature during the deposition of Pd films in an Ar pressure of 6.0×10$^{-3}$ Torr. The final Pd film thickness was about 200 nm. As-deposited Pd films were post-annealed at 500° C. for 0.5 hours in a vacuum of 5.0×10$^{-7}$ Torr. Both the as-deposited and post-annealed Pd have only (001) lattice reflection peaks normal to the substrate surface, which indicates both Pd films possess good out-of-plane orientation. X-ray Φ-scans through Pd(202) show that the Pd film deposited at room temperature possesses good c-axis alignment and in-plane orientation, and that the post-annealing treatment improves the c-axis alignment and in-plane orientation. $CeO_2$ films were deposited on the Pd-buffered Ni substrate by RF magnetron sputtering. For the sputtering deposition, the substrate surface was cleaned before the deposition by reverse sputtering. The substrate was kept at approximately room temperature during $CeO_2$ deposition. The sputtering gas was composed of 20% $O_2$ and 80% Ar at a pressure of 6.6×10$^{-3}$ Torr and the final thickness was 200 nm. The as-deposited $CeO_2$ film was post-annealed at 730° C. for 3 hours in oxygen with partial pressure of 2.3×10$^{-4}$ Torr. FIGS. 5(a) and (b) demonstrates the x-ray θ-2θ scans for both the as-deposited and the post-annealed $CeO_2$ film on Pd-buffered Ni substrates. The strong $CeO_2$ (002) peaks reveals that the $CeO_2$ films have good out-of-plane texture both as-deposited and post-annealed. FIG. 5(b) shows the θ-2θ scans after post-annealing the $CeO_2$ film. The high temperature anneal causes the diffusion of the Ni substrate into the Pd film, since the Pd (002) peak has shifted or completely disappeared. Φ-scans through $CeO_2$ (202), as shown in FIG. 6, reveals that good in-plane orientation with FWHM of 15.6° has been obtained by the room temperature deposition, and that the post-annealing can also improve the orientation somewhat, with FWHM of 11.5°. FIG. 7 shows the rocking curves for $CeO_2$ (002) before and after annealing. The FWHM values for as-deposited $CeO_2$, post-annealed $CeO_2$, and the Ni substrate are about 10°, 8° and 15°, respectively. This indicates that the post-annealing improves the c-axis alignment of the $CeO_2$ film. These values compare very well to the in-plane texture of the present base-metal Ni substrate of 15° FWHM.

The present invention solves the problem of achieving controlled epitaxial deposition of YBCO films on biaxially textured Ni substrates. For example, compared with conventional epitaxial deposition procedures carried out at high temperatures, the low temperature deposition method can minimize the necessity and expense of substrate heating facilities.

The present method reduces the oxidation of substrate surfaces during film deposition, which can adversely affect the deposition of the biaxially textured films. Thus, the low temperature method for fabricating the article makes the invention attractive for applications that are continuous and/or incompatible with high temperature processing.

Although ion beam assisted deposition (IBAD) technique can provide biaxially textured buffer layers at room temperature, the high cost and complications of an IBAD system make the present invention more attractive for large scale production of superconducting tapes for high-current applications.

The present invention enables the formation of biaxially textured metal oxide devices involving high temperature superconductor, ferroelectric, ferromagnetic, and semiconductor films for novel applications. Other applications of this invention include forming ferroelectric/metal heterostructures for ferroelectric random access memory (FRAM) devices, metal/metal oxide heterostructures in multilayer magnetic structures, multilayer optical devices involving transparent metal oxides/metals superlattices and metal/ceramic bonding schemes in circuit board technology.

Ni/$CeO_2$/YSZ/YBCO Superconductor

Figure 8:
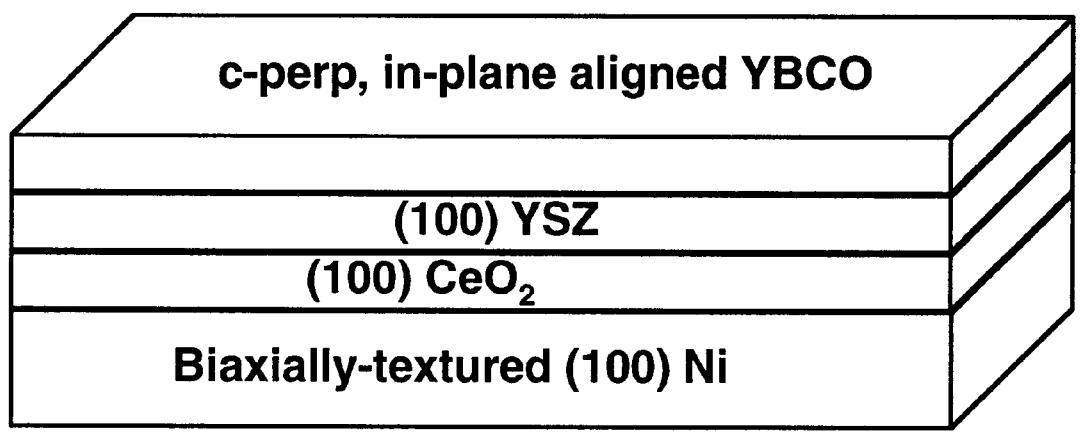
FIG. 8 is a schematic representation of a superconducting article in accordance with the present invention, comprising a biaxially-textured Ni base metal substrate, with deposited epitaxial layers of $CeO_2$, YSZ, and YBCO.

Superconducting Article: A superconducting article, shown schematically in FIG. 8, comprises a biaxially-textured (100) Ni substrate, and epitaxial buffer layers of (100) $CeO_2$ and YSZ, as well as the top layer of in-plane aligned, c-axis oriented YBCO. The (100) Ni preferably has a degree of texture such that the in-plane and out-of-plane alignment is less than approximately 15°, as determined by the full-width-half-maximum of the x-ray diffraction peaks.

Superconducting Article Properties: The YBCO film, $CeO_2$, and YSZ buffer layers are epitaxial with respect to the (100) Ni substrate, with the degree of in-plane and out-of-plane alignment comparable to or better than the base Ni substrate. The superconducting transition temperature is generally greater than 82 K, with a critical current density ($J_c$) in the range of about 100,000 A/cm$^2$ at 77 K. In addition, the magnetic field dependence of $J_c$ will usually be similar to that observed for epitaxial YBCO deposited on single crystal oxide substrates.

Method of Preparation: A smooth (100) Ni tape is usually used as the initial substrate for film deposition. This biaxially-textured metal can be formed by high temperature (>200° C.) recrystallization of cold-rolled pure Ni. Pd can be used instead of Ni as the initial substrate for film deposition. The substrate is preferably cleaned with detergents, organic solvents, and/or etchants. Ion sputtering can also be employed. The Ni substrate is then annealed in hydrogen gas or hydrogen gas mixture at a temperature in the range of about 200° C. to 1200° C., preferably in the range of about 600° C. to 900° C., in order to reduce any NiO on or in the textured substrate and to remove various impurities such as sulfur and carbon from the Ni substrate. After the anneal, the $CeO_2$ film deposition is carried out at a temperature in the range of about 300° C. to 850° C., preferably in the range of about 650° C. to 800° C., by pulsed-laser deposition (PLD), e-beam evaporation or sputtering using a $CeO_2$ ceramic target. The film deposition chamber preferably has a background base pressure of less than $10^{-4}$ Torr, with a hydrogen partial pressure in the range of $2\times10^{-4}$ to 760 Torr, preferably in the range of $10^{-3}$ to $10^{-1}$ Torr, maintained prior to film deposition. The initial 10–1000 Å of $CeO_2$ is preferably deposited with a background hydrogen gas of partial pressure $2\times10^{-4}$ to $2\times10^{-1}$ Torr to minimize the formation of NiO. This initial $CeO_2$ layer will usually be oxygen deficient, but will be (100) oriented with a pseudo-cubic structure. After this initial $CeO_2$ layer is deposited in the presence of a hydrogen background gas, the hydrogen is evacuated from the chamber for subsequent (100) $CeO_2$ film deposition at a temperature in the range of about of 300° C. to 850° C. preferably in the range of about of 650° C. to 800° C. in an oxygen partial pressure of $10^{-6}$ to $10^{-1}$ Torr, preferably in the range of $10^{-5}$ to $10^{-3}$ Torr. After the $CeO_2$ layer is deposited, the YSZ layer is deposited at under similar deposition conditions to a total $CeO_2$/YSZ buffer layer thickness of at least 1000 Å preferably at least 4000 Å. After the YSZ film deposition, the YBCO film is then deposited by PLD at a temperature in the range of about 600–1000° C., preferably about 780° C. in about 200 mTorr oxygen pressure. The article is then cooled to room temperature with oxygen pressure increased to approximately 600 Torr during the cool-down.

EXAMPLE III

Figure 9:
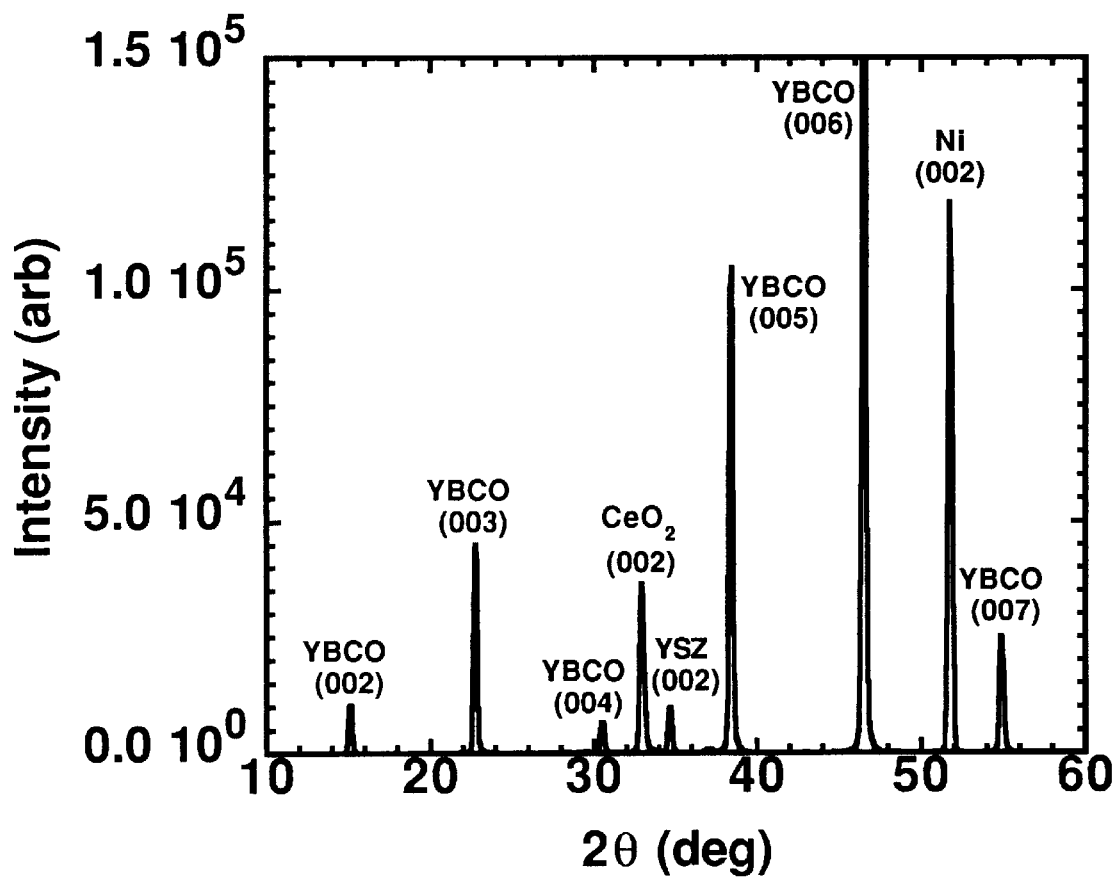
FIG. 9 shows X-ray diffraction θ-2θ scans of a superconducting article in accordance with the present invention, showing predominantly (001) reflections of the $CeO_2$, YSZ, and YBCO, indicating crystalline alignment of all three layers.
Figure 10:
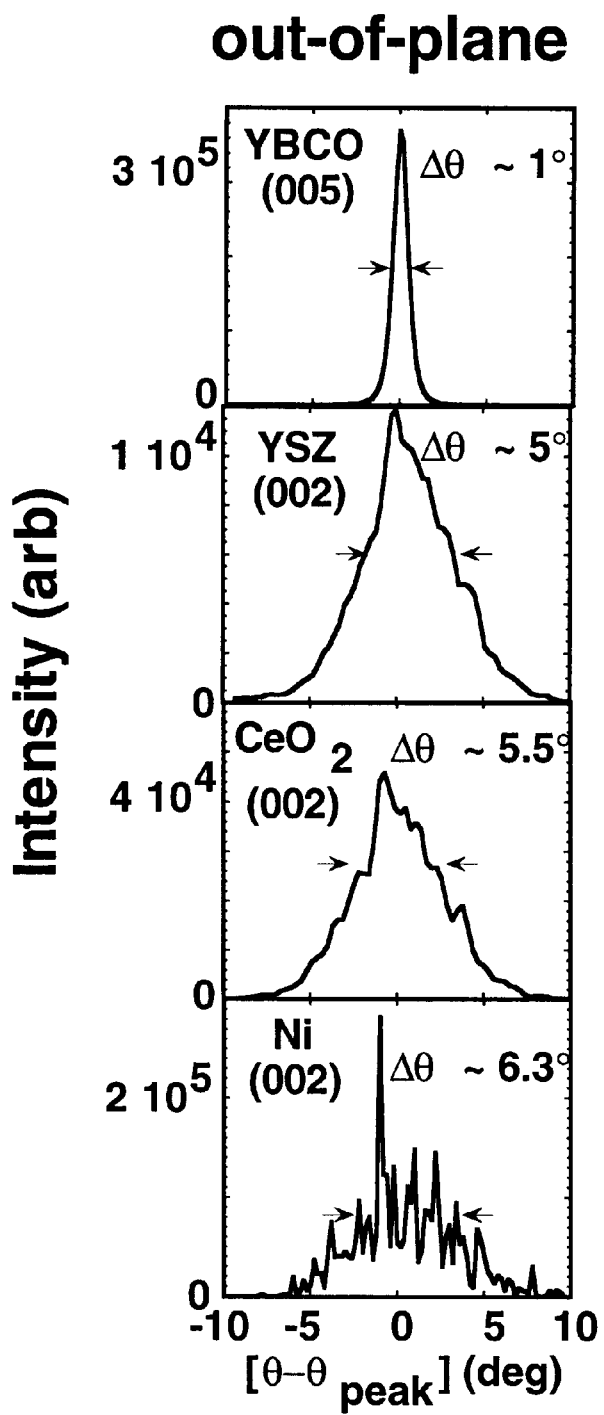
FIG. 10 shows X-ray diffraction rocking curves, showing the out-of-plane alignment of the base metal Ni, buffer layers of $CeO_2$ and YSZ, and top layer of YBCO in accordance with the present invention.
Figure 11:
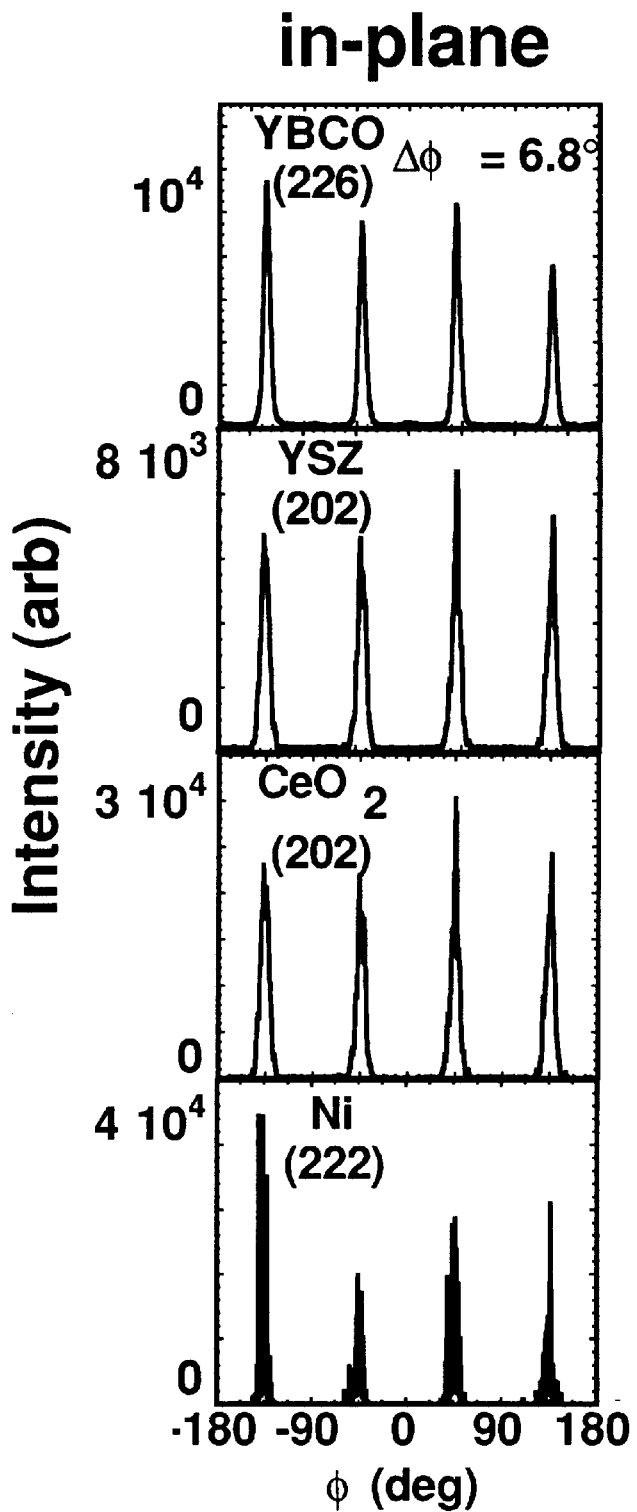
FIG. 11 shows X-ray diffraction Φ-scans of off-axis reflections, showing the in-plane alignment of the base metal Ni, buffer layers of $CeO_2$ and YSZ, and top layer of YBCO in accordance with the present invention. The epitaxial layers replicate the 8° FWHM peak-width of the Ni substrate.
Figure 12:
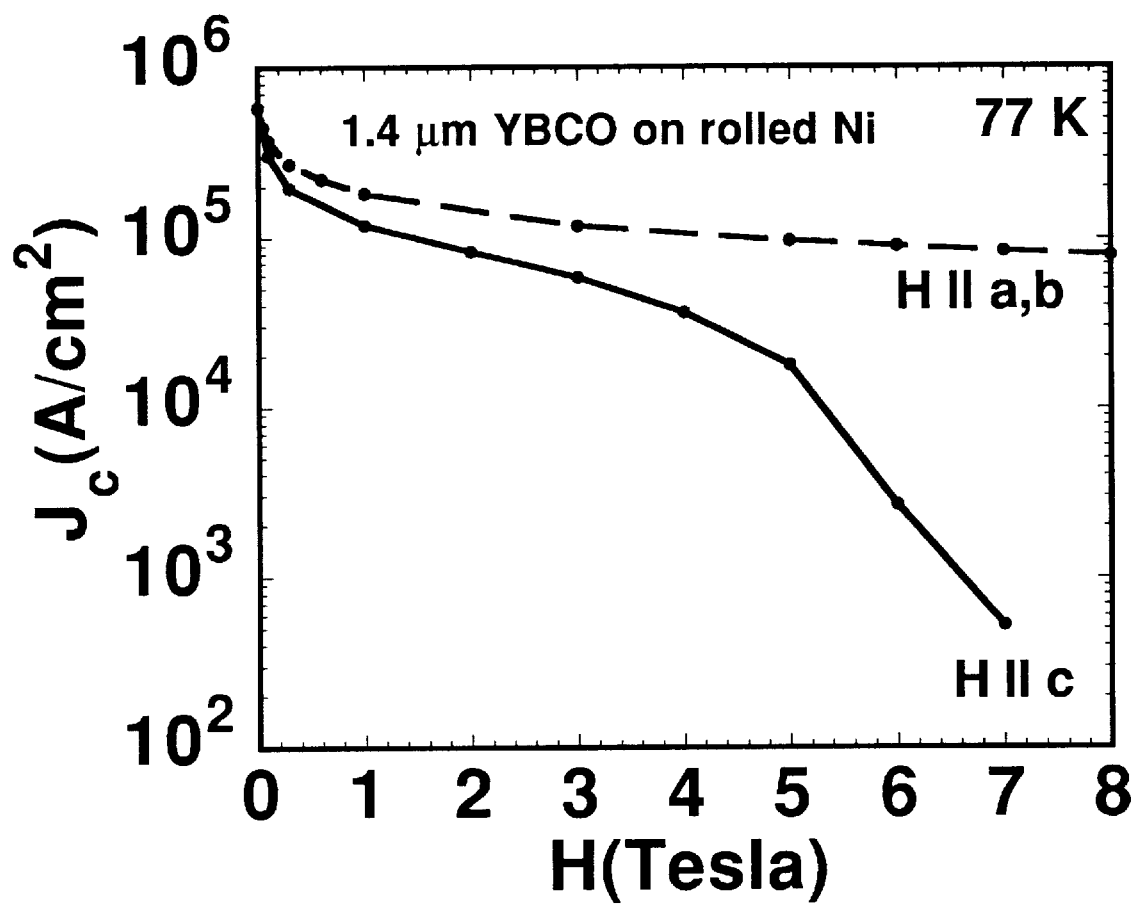
FIG. 12 shows the dependence of critical current density $J_c$ on magnetic field at 77 K. The superconducting article in accordance with the present invention is compared to a YBCO epitaxial film deposited on the single crystal oxide substrate $SrTiO_3$. The magnetic field is applied parallel to the crystal c-axis, which is the applications-limiting situation.

A (100) rolled-textured Ni substrate was cleaned with solvents and annealed in forming gas (4% $H_2$/96% Ar) for 1 hr at 900° C. The substrate was then immediately loaded into a PLD chamber, which was evacuated to a base pressure less than $10^{-5}$ Torr. A 4% $H_2$/Ar mixture was introduced into the chamber at a total pressure of 180 mTorr. The substrate was then heated to 780° C. in the 180 mTorr $H_2$/Ar mixture. At 780° C., a $CeO_2$ film that was approximately 250 Å thick was deposited by PLD in the presence of the 180 mTorr 4% $H_2$/Ar background gas. A ceramic $CeO_2$ target was used as the ablation target. The deposition rate was ~1.5 Å/sec with a KrF 248 nm excimer laser pulse energy of ~3 J/cm$^2$. The presence of the hydrogen minimizes the formation of NiO at the Ni surface during the $CeO_2$ deposition. After depositing this initial 250 Å thick $CeO_2$ layer with a hydrogen background, the 4% $H_2$/Ar mixture was evacuated to a base pressure less than $2\times10^{-5}$ Torr. A 250 Å thick $CeO_2$ layer was subsequently deposited by PLD in vacuum (P<$2\times10^{-5}$ Torr) at 780° C. The oxygen pressure was then increased to ~$3\times10^{-4}$ Torr. A ~4000 Å thick layer of $CeO_2$ was then deposited, followed by a ~5000 Å thick YSZ layer, all at 780° C. in an oxygen pressure of $3\times10^{-4}$ Torr. The oxygen pressure was then increased to 180 mTorr for the deposition of a 1.4 $\mu$m thick $YBa_2Cu_3O_7$ film. After film deposition, the sample was cooled at 10° C./min in an oxygen pressure of 180 mTorr. At 400° C., the oxygen pressure was increased to 690 Torr. The sample was subsequently annealed at 450° C. in 1 atm oxygen to insure full oxidation of the $YBa_2Cu_3O_7$. FIG. 9 shows the θ-2θ x-ray diffraction scan of the $YBa_2Cu_3O_7$/YSZ/$CeO_2$/Ni structure. The ratio of the (200)/(111) $CeO_2$ peaks is ~100, indicating that the majority of the $CeO_2$ film is (001) oriented. The rocking curves through (001) peaks for each layer, shown in FIG. 10, indicates an out-of-plane full-width half-maximum (FWHM) of ~1° for the (005) $YBa_2Cu_3O_7$, which is better than that of the (100) rolled Ni substrate. The in-plane epitaxial relationship of the oxide layers with the Ni substrate can be seen in the Φ-scans shown in FIG. 11. The oxide layers are all in-plane aligned with an in-plane FWHM of ~7°. The $YBa_2Cu_3O_7$ film was superconducting with a superconducting transition temperature of 88 K, and a critical current density, $J_c$(77 K, H=0)=700,000 A/cm$^2$. The magnetic field dependence of the superconducting article, as shown in FIG. 12, is similar to that observed for epitaxial $YBa_2Cu_3O_7$ films on (100) single crystal $SrTiO_3$.

Ni/$CeO_2$/YSZ Article

Epitaxial oxide buffered laminate article: An epitaxial oxide buffered laminate article, useful as a substrate for electronic oxide film deposition, comprises a biaxially-textured (100) Ni or Pd substrate, and epitaxial buffer layer of (100) $CeO_2$. The article may also include a top YSZ layer as an additional oxide buffer layer.

Epitaxial oxide buffered laminate article properties: A metallic base with a biaxially-textured (100) $CeO_2$ or YSZ surface that is chemically compatible with subsequent epitaxial deposition of other electronic oxide films. If the Ni tape is flexible, the laminate article will be flexible as well.

Method of preparation: The method of preparation is the same as that described above for the superconducting article, omitting the deposition and oxidation of the superconducting film. The subsequent article will be useful as a substrate for the deposition of biaxially-textured oxides, such as superconductors, ferroelectrics, magnetic layers, and luminescent materials.

EXAMPLE IV

Figure 13:
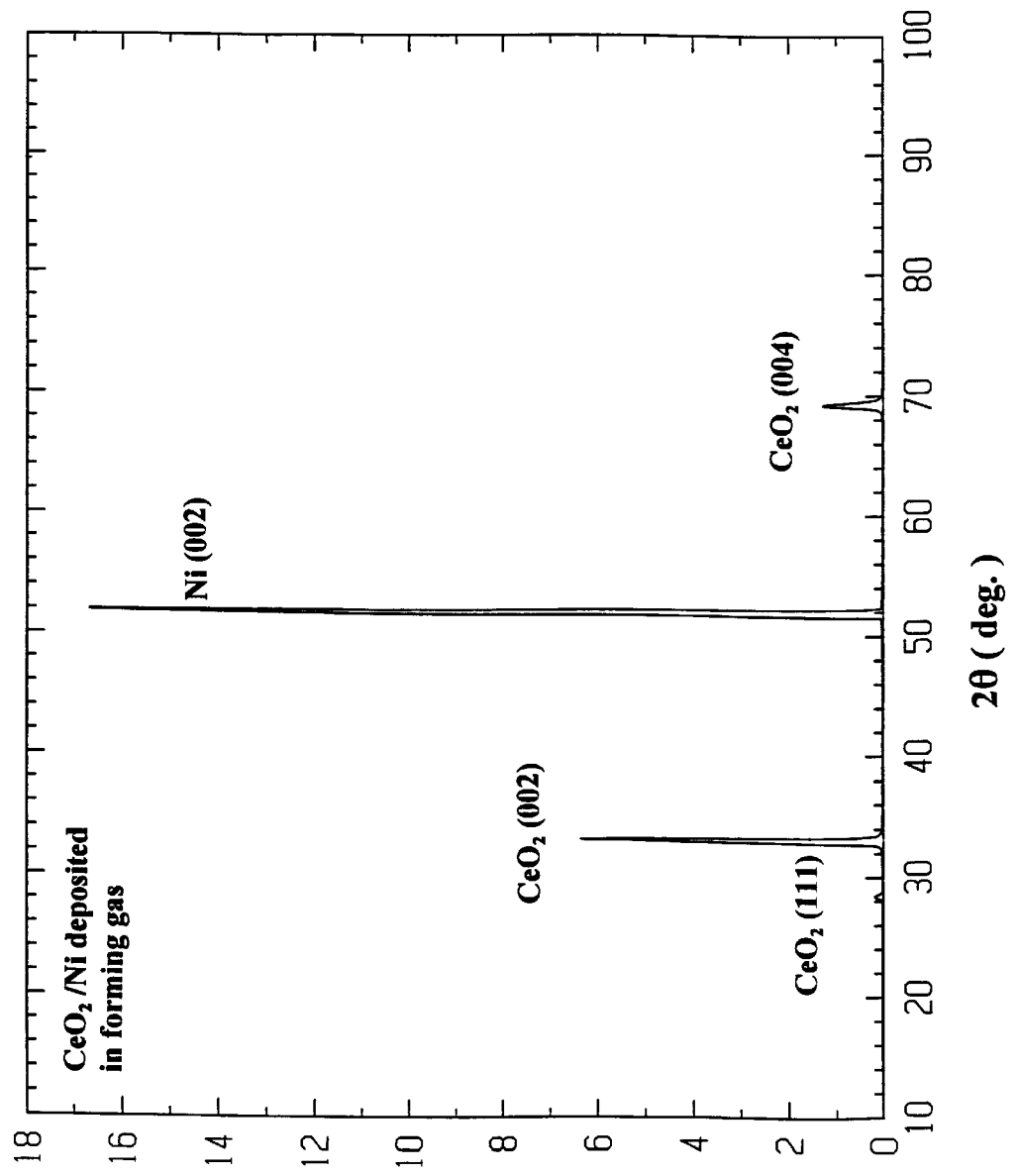
FIG. 13 shows, in accordance with the present invention, X-ray diffraction θ-2θ scans for post-annealed $CeO_2$ film on Ni. The annealing condition is 730° C. for 3 hours in oxygen with $2.3 \times 10^{-4}$ Torr partial pressure.
Figure 14:
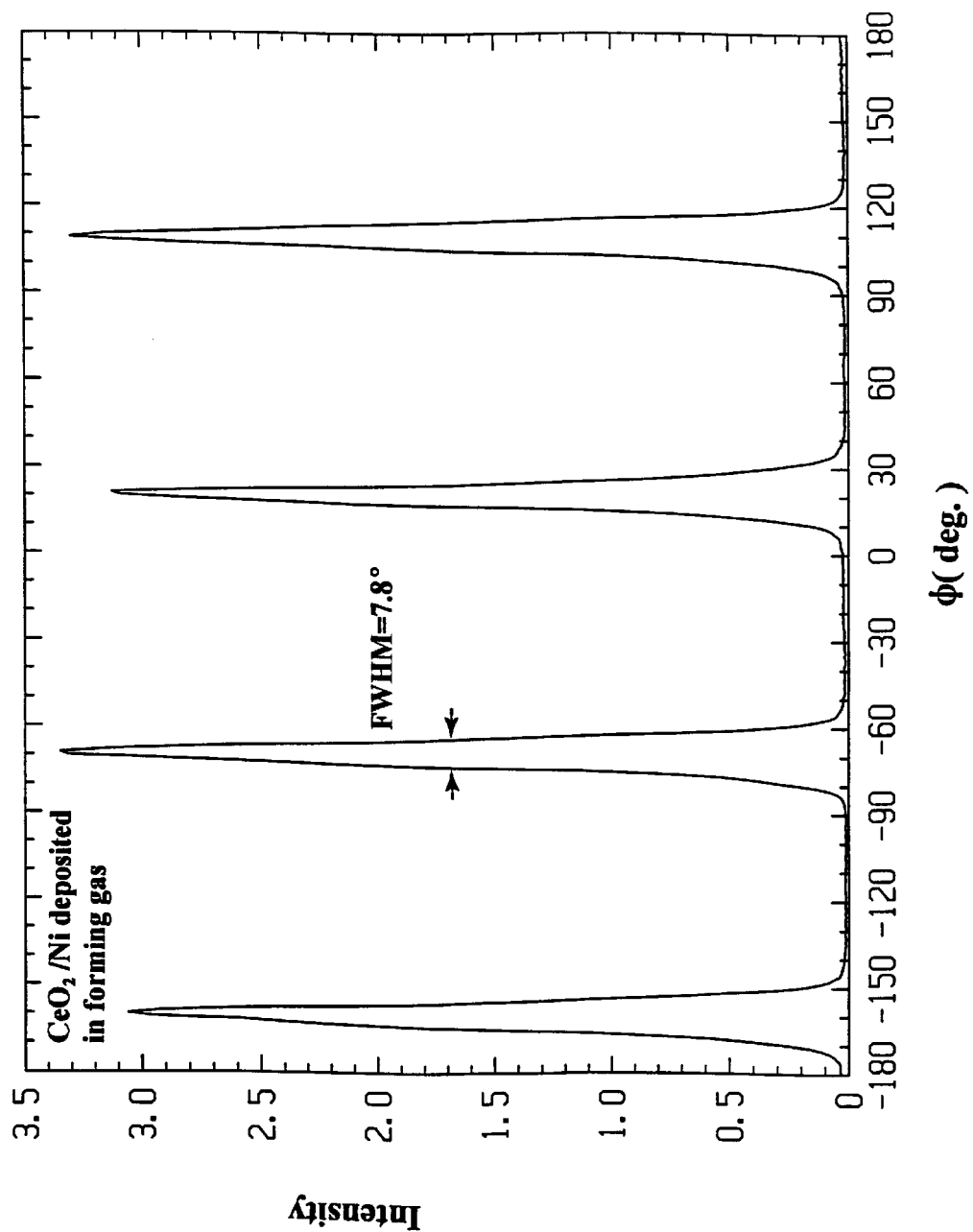
FIG. 14 shows, in accordance with the present invention, X-ray diffraction Φ-scans for as-deposited and post-annealed $CeO_2$ films on Ni substrates with FWHM values of 15.6° and 11.5°, respectively.

A biaxially-textured (100) Ni substrate was placed in a RF sputtering system that was subsequently evacuated to a base pressure of ~$10^{-7}$ Torr. The Ni substrate was then annealed in a 4% $H_2$/96% Ar mixture at 700° C. for 4 hrs with a $H_2$/Ar mixture pressure of 8 Torr. The (100) Ni was then cooled to ~400° C. in the 4% $H_2$/Ar mixture for $CeO_2$ deposition. An initial 300 Å thick layer was then deposited by RF sputtering in a 4% $H_2$/Ar mixture pressure of $8\times10^{-2}$. After this initial layer, the 4% $H_2$/Ar mixture was replaced by pure Ar gas. Subsequently, a 10% $O_2$/90% Ar mixture at a pressure of $9\times10^{-3}$ Torr was introduced into the system for additional $CeO_2$ deposition on the initial oxide layer. During the transition in sputtering gas mixtures, sputter deposition at a sputtering power of 65 W continued. FIG. 13 shows the θ-2θ x-ray diffraction scans for the post-annealed $CeO_2$ film on the (100) Ni substrate. The predominant (001) reflections for the $CeO_2$ indicate excellent c-axis orientation. The x-ray rocking curve through the $CeO_2$ (002) reflection shows a FWHM of 6.5°. FIG. 14 shows the x-ray diffraction Φ-scans for the $CeO_2$ film through the (202) reflection with a FWHM value of ~7.8°. Both the in-plane and out-of-plane alignments of the $CeO_2$ film are comparable to that of the (100) Ni substrate.

Other Embodiments of the Invention

An electron beam evaporation method is used to deposit epitaxial $CeO_2$ films directly on Ni or Pd in order to produce articles in accordance with the present invention. The examples given below are not to be construed to limit the process. Those skilled in the art will readily recognize that the parameters used can be varied or modified without departing from the scope of the invention.

EXAMPLE V

Figure 15:
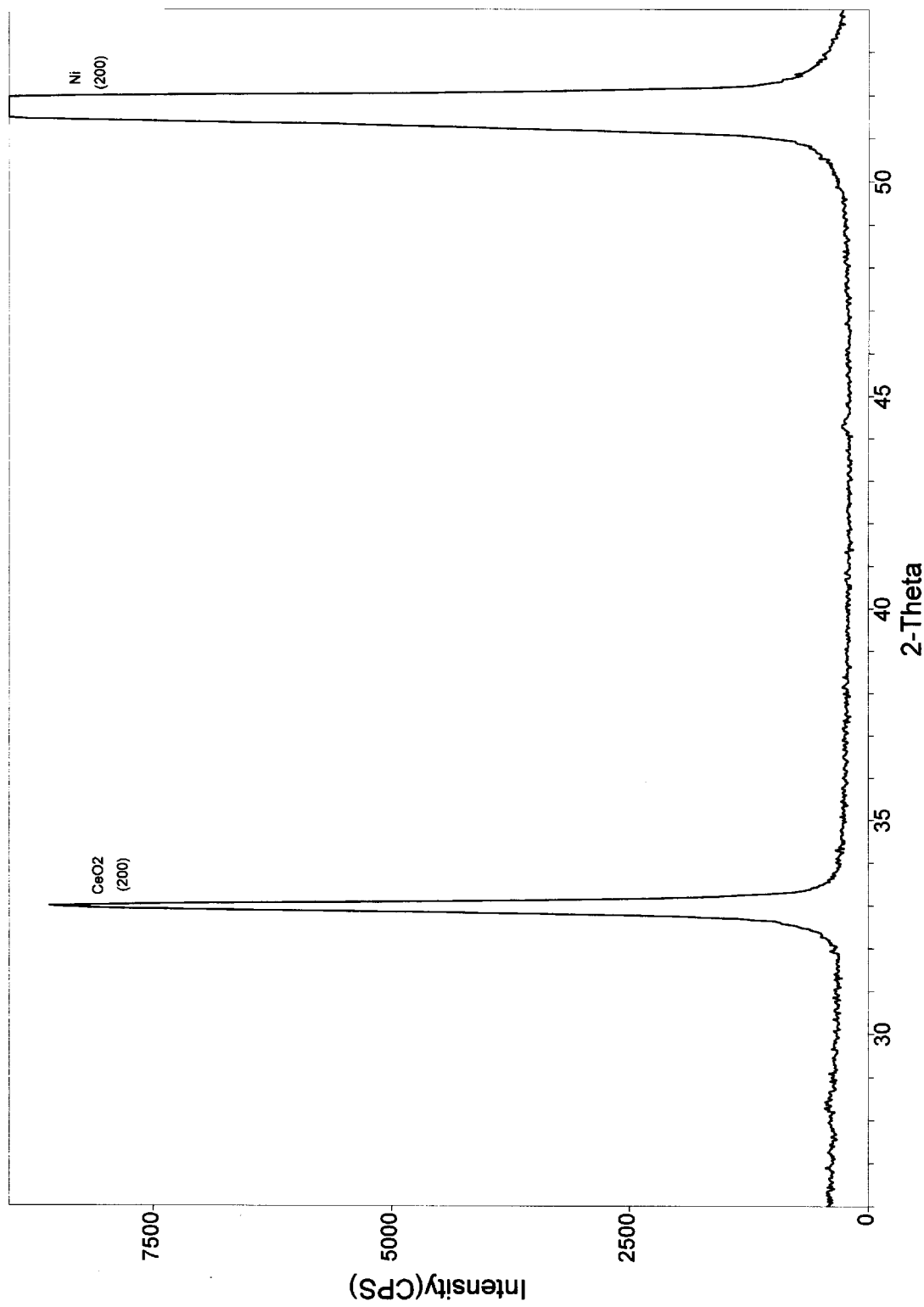
FIG. 15 shows, in accordance with the present invention, a room temperature powder θ-2θ x-ray diffraction pattern for a $CeO_2$ film deposited on a Ni substrate by e-beam evaporation.

An electron beam evaporation method was used to deposit $CeO_2$ films directly on Ni. Biaxially oriented Ni substrates were cleaned ultrasonically with both acetone and methanol, and mounted on a substrate holder with a heater assembly in the e-beam system. After the vacuum in the chamber had reached $1 \times 10^{-6}$ Torr at room temperature, a gas mixture of 4% $H_2$ and 96% Ar was introduced until the pressure inside the chamber reached ~1 Torr. The Ni substrates were annealed at ~700° C. (preferable range is 500°–800° C.) for 30 minutes at that pressure. The chamber was then maintained at a pressure of $1 \times 10^{-5}$ Torr (preferable pressure range is below $10^{-4}$ Torr) with a mixture of 4% $H_2$ and 96% Ar. The $CeO_2$ layers were deposited on the Ni substrates at temperatures ranging from 300 to 750° C. The deposition rate for $CeO_2$ was 1 Å/sec with the operating pressure of $10^{-5}$ Torr (preferable pressure range is below $10^{-4}$ Torr), and the final thickness was varied from 50 nm to 200 nm. The crucibles were mostly graphite. Cerium metal was used as the source. The XRD results from the θ-2θ scan, as shown in FIG. 15, for as-deposited $CeO_2$ (100 nm thick) on Ni at 600° C. are as follows. The strong $CeO_2$ (002) from FIG. 15 revealed the presence of a good out-of-plane texture. The FWHM for Ni (002) and $CeO_2$ (002) are 6.2° and 7.5°, and that of Ni (202) and $CeO_2$ (202) are 8.6° and 14.1°, respectively. From the XRD results, we can conclude that $CeO_2$ was deposited epitaxially on Ni.

EXAMPLE VI

Figure 16:
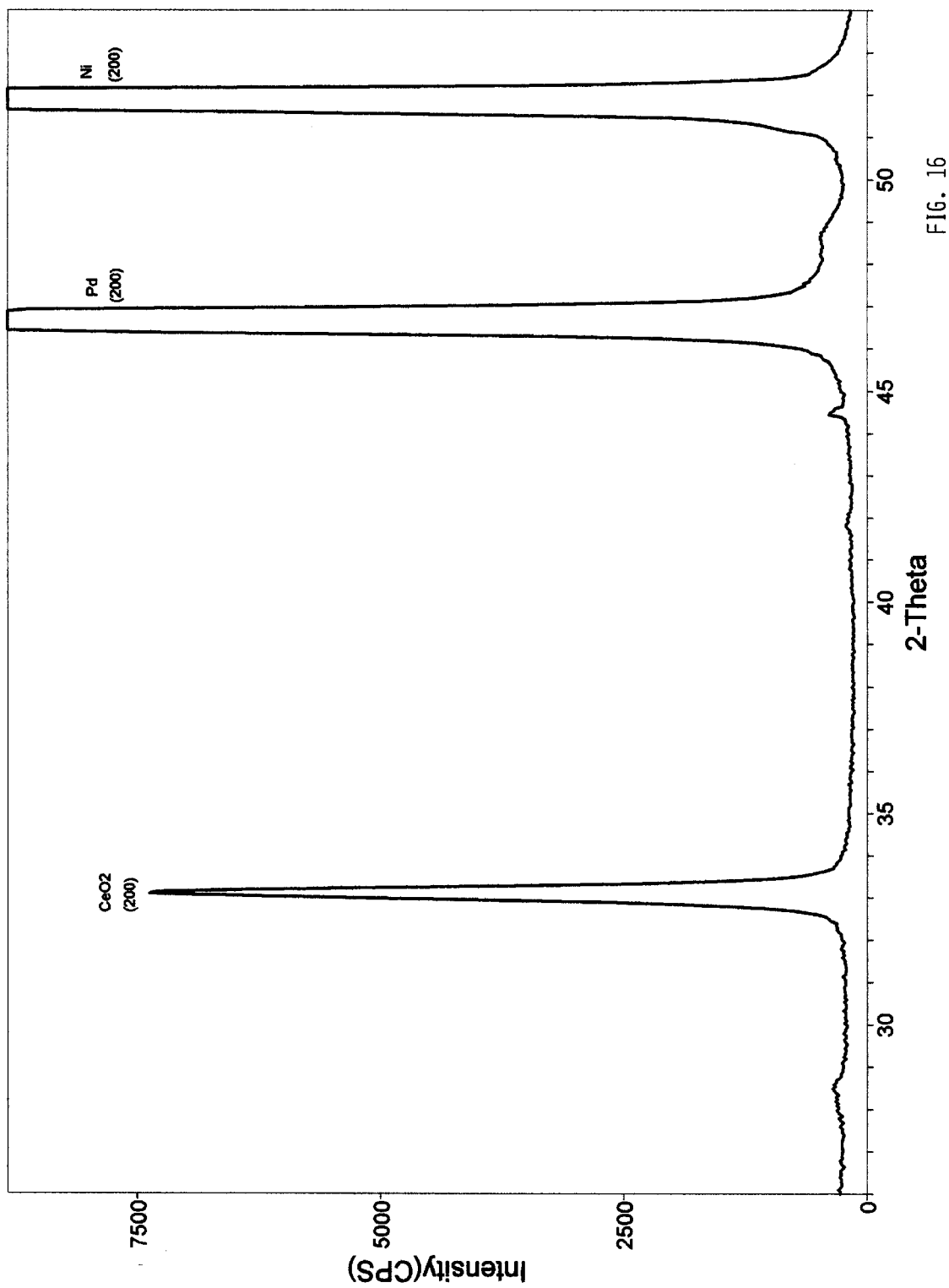
FIG. 16 shows, in accordance with the present invention, a room temperature powder θ-2θ x-ray diffraction pattern for a $CeO_2$ film deposited on a Pd-buffered Ni substrate by e-beam evaporation.

Initially, biaxially textured Ni substrates were cleaned and Pd films were deposited on them as discussed in Example I. $CeO_2$ films were then deposited on the Pd-buffered Ni substrates by e-beam evaporation. After the vacuum in the chamber had reached $1 \times 10^{-6}$ Torr at room temperature, a gas mixture of 4% $H_2$ and 96% Ar was introduced until the pressure inside the chamber reached $\sim 10^{-4}$ Torr. The Pd-buffered Ni substrates were annealed at ~700° C. (preferable range is 400°–800° C.) for 15 minutes at that pressure. Interdiffusion of Ni and Pd were avoided. The chamber was then maintained at $2 \times 10^{-5}$ (preferable pressure range is below $10^{-4}$ Torr) with a mixture of 4% $H_2$ and 96% Ar. The $CeO_2$ layers were deposited on the Pd-buffered Ni at temperatures ranging from 200 to 750° C. The deposition rate for $CeO_2$ was 1 Å/sec with the 4% $H_2$/96% Ar pressure of $10^{-5}$ Torr in the chamber, and the final thickness was varied from 50 nm to 200 nm. Cerium metal was used as the source. The crucibles used were mostly graphite. The XRD results from the θ-2θ, shown in FIG. 16 for as-deposited $CeO_2$ (100 nm thick) on Pd-buffered Ni at 400° C. are as follows. The strong $CeO_2$ (002) from FIG. 16 revealed the presence of a good out-of-plane texture. The FWHM for Ni (002), Pd (002) and $CeO_2$ (002) are 6.8°, 3.4° and 4.35°, and that of Ni (202), Pd (202) and $CeO_2$ (202) are 9.0°, 6.40° and 8.45°, respectively. From the XRD results, we can conclude that Pd followed by $CeO_2$ was deposited epitaxially on Ni.

In yet another embodiment of the present invention, YSZ can be deposited on $CeO_2$ buffered Ni by magnetron sputtering.

Figure 17:
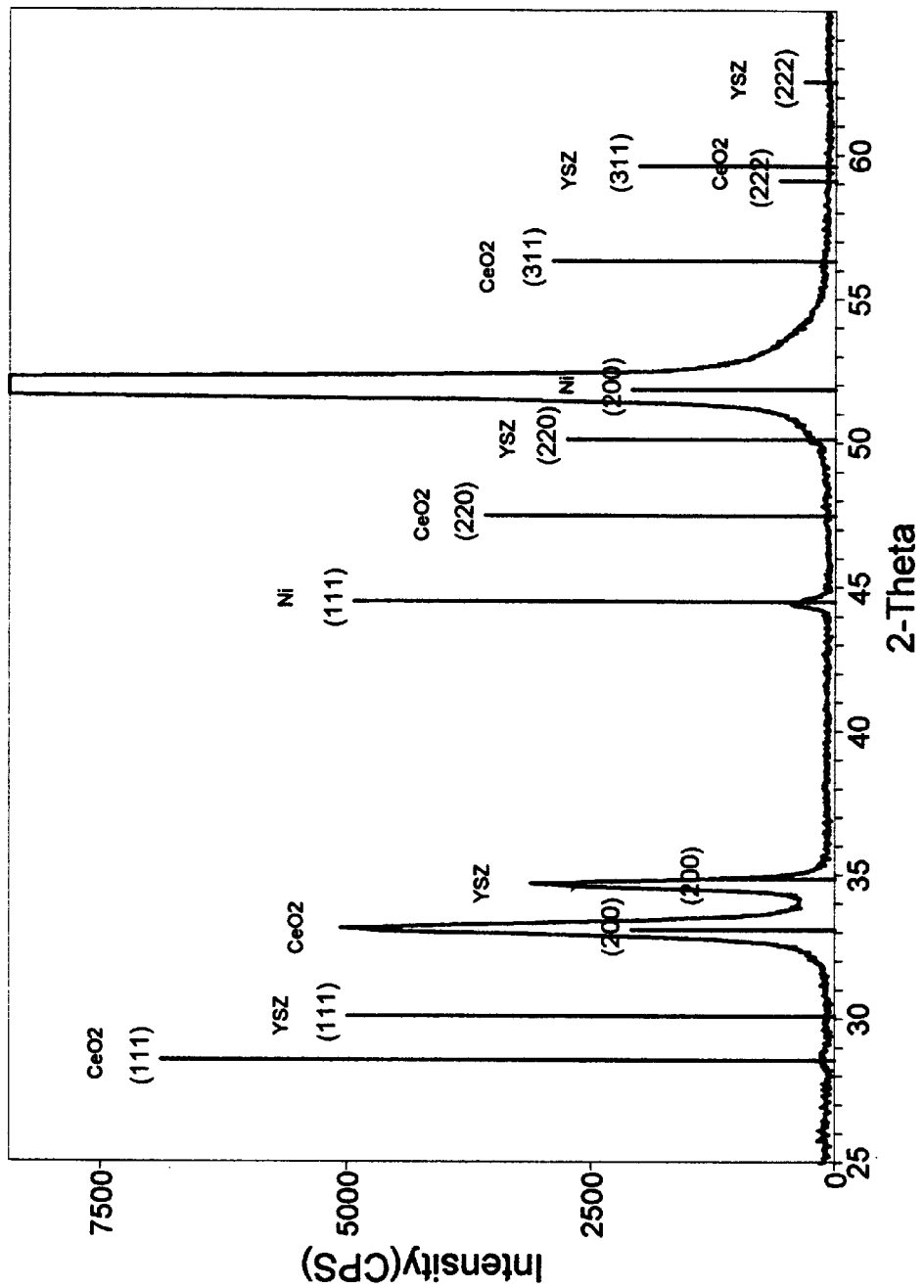
FIG. 17 shows, in accordance with the present invention, a room temperature powder θ-2θ x-ray diffraction pattern for YSZ deposited on $CeO_2$ films on Ni substrates by rf magnetron sputtering.

EXAMPLE VII $CeO_2$ films were deposited epitaxially by e-beam evaporation on rolled Ni substrates as discussed in Example V. The YSZ films were deposited on these $CeO_2$-buffered Ni substrates by rf magnetron sputtering. The substrate was initially cleaned with acetone and ethanol and then mounted in the sputter chamber. Heating was accomplished resistively by passing current through the substrate. The temperature of the substrate was both determined and controlled with a thermocouple that was spot-welded to the back of substrate's center. Prior to heating the substrate, the sputter chamber was evacuated to a pressure of $<1 \times 10^{-5}$ Torr. The chamber was then back-filled with a flowing mixture of 4% $H_2$/96% Ar to a pressure of $1.0 \times 10^{-2}$ T. The substrate was resistively heated from ~20 to 750° C. at a rate of 1000° C./min and sputter deposited at 750° C. for 30 min with an on-axis YSZ target located 7 cm from the substrate. The plasma power was 75 W at 13.56 MHz. The resulting YSZ film was smooth and transparent, and its thickness was estimated to be approximately 1000 Å. FIG. 17 is a θ-2θ x-ray scan showing good out-of-plane texture for the YSZ which is consistent with epitaxy.

An alternative cleaning method involves ion sputter cleaning of the Ni base metal surface prior to and during initial deposition of $CeO_2$. In this case, sputter cleaning replaces hydrogen reduction in removing the native oxide.

Biaxially-textured (100) Ni can be substituted with biaxially-textured (100)Pd. The deposition of a (100) Pd film, as described in the above description, is not required in this case. All other details regarding article description and method of preparation is as described above. The resulting biaxially-textured (100) Pd/$CeO_2$/YSZ/superconductor structure will have properties similar to those described above.

Another useful method in forming the superconducting article, resulting in a superconducting oxide film in which the in-plane and out-of-plane alignment is less than 1° and $J_c$ within a factor of 2 of the best reported values is to deposit epitaxial (100) Pd or Ni films on (100) NaCl single crystals with in-plane and out-of-plane alignment to within 1°. Dissolving the NaCl in water results in a biaxially-textured (100) Pd or Ni substrate with an in-plane and out-of-plane alignment to within 1°. Applying the above described methods of preparation using these biaxially textured (100) Pd or Ni substrates results in a biaxially textured superconducting article with superconducting properties approaching that observed for epitaxial superconducting oxides deposited on single crystal oxide substrates.

While there has been shown and described what are at present considered the preferred embodiments of the invention, it will be obvious to those skilled in the art that various changes and modifications can be made therein without departing from the scope of the inventions defined by the appended claims.

What is claimed is:

1. A biaxially textured article comprising a biaxially textured Ni substrate having thereon an epitaxial buffer layer of $CeO_2$.

2. An article in accordance with claim 1 further comprising an epitaxial buffer layer of yttria-stabilized $ZrO_2$ on said epitaxial buffer layer of $CeO_2$.

3. An article in accordance with claim 2 wherein said epitaxial buffer layer of yttria-stabilized $ZrO_2$ has thereon an epitaxial superconducting layer.

4. An article in accordance with claim 3 wherein said epitaxial superconducting layer comprises $YBa_2Cu_3O_{7-\delta}$ having a critical current density of at least 100,000 Amps/$cm^2$ at a temperature of 77 K.

5. A biaxially textured article comprising a biaxially textured Ni substrate having thereon an epitaxial layer of palladium, said epitaxial layer of palladium having thereon an epitaxial buffer layer of $CeO_2$.

6. An article in accordance with claim 5 further comprising an epitaxial buffer layer of yttria-stabilized $ZrO_2$ on said epitaxial buffer layer of $CeO_2$.

7. An article in accordance with claim 6 wherein said epitaxial buffer layer of yttria-stabilized $ZrO_2$ has thereon an epitaxial superconducting layer.

8. An article in accordance with claim 7 wherein said epitaxial superconducting layer comprises $YBa_2Cu_3O_{7-\delta}$ having a critical current density of at least 100,000 Amps/$cm^2$ at a temperature of 77 K.

9. A biaxially textured article comprising a biaxially textured palladium substrate having thereon an epitaxial buffer layer of $CeO_2$, said epitaxial buffer layer of $CeO_2$ having thereon an epitaxial buffer layer of yttria-stabilized $ZrO_2$.

10. An article in accordance with claim 9 wherein said epitaxial buffer layer of yttria-stabilized $ZrO_2$ has thereon an epitaxial superconducting layer.

11. An article in accordance with claim 10 wherein said epitaxial superconducting layer comprises $YBa_2Cu_3O_{7-\delta}$ having a critical current density of at least 100,000 Amps/$cm^2$ at a temperature of 77 K.

12. A method of preparing a biaxially textured article comprising the steps of:
   a. providing a biaxially textured Ni substrate having a surface; and,
   b. depositing onto said surface, in the presence of hydrogen gas, an epitaxial buffer layer of $CeO_2$.

13. A method in accordance with claim 12 wherein said biaxially textured Ni substrate is prepared by rolling and annealing.

14. A method in accordance with claim 13 wherein said annealing is carried out in the presence of hydrogen at a temperature greater than 200° C.

15. A method in accordance with claim 12 wherein said step of depositing onto said surface an epitaxial buffer layer of $CeO_2$ comprises depositing, via a pulsed-laser deposition method, an electron beam evaporation method or a sputtering method, a layer of $CeO_2$.

16. A method in accordance with claim 15 wherein said deposition method further comprises the additional steps of:
   a. evacuating the hydrogen; and,
   b. depositing additional $CeO_2$ via said deposition method.

17. A method in accordance with claim 12 wherein said biaxially textured Ni substrate is prepared by a method comprising the steps of:
   a. depositing an epitaxial layer of Ni onto a NaCl single crystal; and
   b. dissolving said NaCl single crystal to form a biaxially textured Ni substrate.

18. A method in accordance with claim 12 wherein said biaxially textured Ni substrate is prepared by a method comprising the steps of:
   a. depositing an epitaxial metal layer onto a NaCl single crystal;
   b. depositing onto said epitaxial metal layer an epitaxial layer of Ni; and
   c. dissolving said NaCl single crystal to form a biaxially textured Ni substrate.

19. A method in accordance with claim 18 wherein said epitaxial metal layer is selected from the group consisting of face-centered cubic and body-centered cubic metals.

20. A method in accordance with claim 12 further comprising an additional step of depositing onto said epitaxial buffer layer of $CeO_2$ an epitaxial buffer layer of yttria-stabilized $ZrO_2$.

21. A method in accordance with claim 20 wherein said step of depositing onto said surface an epitaxial buffer layer of yttria-stabilized $ZrO_2$ comprises depositing, via a pulsed-laser deposition method, or a sputtering method, a layer of yttria-stabilized $ZrO_2$.

22. A method in accordance with claim 20 further comprising an additional step of depositing onto said epitaxial buffer layer of yttria-stabilized $ZrO_2$ an epitaxial superconducting layer.

23. A method in accordance with claim 22 wherein said epitaxial superconducting layer comprises $YBa_2Cu_3O_{7-\delta}$ having a critical current density of at least 100,000 Amps/$cm^2$ at a temperature of 77 K.

24. A method of preparing a biaxially textured article comprising the steps of:
   a. providing a biaxially textured Ni substrate having a surface;
   b. depositing onto said surface an epitaxial buffer layer of palladium; and,
   c. depositing onto said epitaxial buffer layer of palladium an epitaxial buffer layer of $CeO_2$.

25. A method in accordance with claim 24 wherein said biaxially textured Ni substrate is prepared by rolling and annealing.

26. A method in accordance with claim 24 wherein said epitaxial buffer layers of palladium and $CeO_2$ are deposited at a temperature below 300° C.

27. A method in accordance with claim 25 wherein said annealing is carried out in the presence of hydrogen at a temperature greater than 200° C.

28. A method in accordance with claim 24 wherein said step of depositing onto said surface an epitaxial buffer layer of $CeO_2$ comprises depositing, via a pulsed-laser deposition method, an electron beam evaporation method or a sputtering method, a layer of $CeO_2$.

29. A method in accordance with claim 24 wherein said biaxially textured Ni substrate is prepared by a method comprising the steps of:
   a. depositing an epitaxial layer of Ni onto a NaCl single crystal;
   b. dissolving said NaCl single crystal to form a biaxially textured Ni substrate.

30. A method in accordance with claim 24 wherein said biaxially textured Ni substrate is prepared by a method comprising the steps of:
   a. depositing an epitaxial metal layer onto a NaCl single crystal, said epitaxial metal layer selected from the group consisting of face-centered cubic and body-centered cubic metals;
   b. depositing onto said epitaxial metal layer an epitaxial layer of Ni; and
   c. dissolving said NaCl single crystal to form a biaxially textured Ni substrate.

31. A method in accordance with claim 24 further comprising an additional step of depositing onto said epitaxial buffer layer of $CeO_2$ an epitaxial buffer layer of yttria-stabilized $ZrO_2$.

32. A method in accordance with claim 31 wherein said step of depositing onto said surface an epitaxial buffer layer of yttria-stabilized $ZrO_2$ comprises depositing, via a pulsed-laser deposition method, or a sputtering method, a layer of yttria-stabilized $ZrO_2$.

33. A method in accordance with claim 31 further comprising an additional step of depositing onto said epitaxial buffer layer of yttria-stabilized $ZrO_2$ an epitaxial superconducting layer.

34. A method in accordance with claim 33 wherein said epitaxial superconducting layer comprises $YBa_2Cu_3O_{7-\delta}$ having a critical current density of at least 100,000 Amps/$cm^2$ at a temperature of 77 K.

35. A method of preparing a biaxially textured article comprising the steps of:
   a. providing a biaxially textured palladium substrate having a surface; and,
   b. depositing onto said surface an epitaxial buffer layer of $CeO_2$.

36. A method in accordance with claim 35 wherein said epitaxial buffer layer of $CeO_2$ is deposited at a temperature below 300° C.

37. A method in accordance with claim 35 wherein said biaxially textured palladium substrate is prepared by rolling and annealing.

38. A method in accordance with claim 35 wherein said step of depositing onto said surface an epitaxial buffer layer of $CeO_2$ comprises depositing, via a pulsed-laser deposition method, an electron beam evaporation method or a sputtering method, a layer of $CeO_2$.

39. A method in accordance with claim 35 wherein said biaxially textured palladium substrate is prepared by a method comprising the steps of:
   a. depositing an epitaxial layer of palladium onto a NaCl single crystal;
   b. dissolving said NaCl single crystal to form a biaxially textured palladium substrate.

40. A method in accordance with claim 35 wherein said biaxially textured palladium substrate is prepared by a method comprising the steps of:
   a. depositing an epitaxial metal layer onto a NaCl single crystal, said epitaxial metal layer selected from the group consisting of face-centered cubic and body-centered cubic metals;
   b. depositing onto said epitaxial metal layer an epitaxial layer of palladium; and
   c. dissolving said NaCl single crystal to form a biaxially textured palladium substrate.

41. A method in accordance with claim 35 further comprising an additional step of depositing onto said epitaxial buffer layer of $CeO_2$ an epitaxial buffer layer of yttria-stabilized $ZrO_2$.

42. A method in accordance with claim 41 wherein said step of depositing onto said surface an epitaxial buffer layer of yttria-stabilized $ZrO_2$ comprises depositing, via a pulsed-laser deposition method, or a sputtering method, a layer of yttria-stabilized $ZrO_2$.

43. A method in accordance with claim 41 further comprising an additional step of depositing onto said epitaxial buffer layer of yttria-stabilized $ZrO_2$ an epitaxial superconducting layer.

44. A method in accordance with claim 43 wherein said epitaxial superconducting layer comprises $YBa_2Cu_3O_{7-\delta}$ having a critical current density of at least 100,000 Amps/$cm^2$ at a temperature of 77 K.

* * * * *